(12) United States Patent
Ge et al.

(10) Patent No.: US 10,714,179 B2
(45) Date of Patent: Jul. 14, 2020

(54) HYBRID MEMORY DEVICES

(71) Applicant: HEWLETT-PACKARD DEVELOPMENT COMPANY, L.P., Houston, TX (US)

(72) Inventors: Ning Ge, Palo Alto, CA (US); Steven J Simske, Fort Collins, CO (US); David George, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/323,072

(22) PCT Filed: Oct. 7, 2016

(86) PCT No.: PCT/US2016/055911
§ 371 (c)(1),
(2) Date: Feb. 4, 2019

(87) PCT Pub. No.: WO2018/067168
PCT Pub. Date: Apr. 12, 2018

(65) Prior Publication Data
US 2019/0221261 A1    Jul. 18, 2019

(51) Int. Cl.
*G11C 13/00* (2006.01)
*G11C 14/00* (2006.01)
(Continued)

(52) U.S. Cl.
CPC ...... *G11C 14/0045* (2013.01); *H01L 27/1085* (2013.01); *H01L 27/10805* (2013.01);
(Continued)

(58) Field of Classification Search
CPC .............................. G11C 13/0069; G11C 7/12
(Continued)

(56) References Cited

U.S. PATENT DOCUMENTS 8,219,741 B2   7/2012  Condit et al.
8,576,607 B1  11/2013  Nemati
(Continued)

FOREIGN PATENT DOCUMENTS

CN        103810126 A     5/2014
WO     WO-2016069487 A1   5/2016

OTHER PUBLICATIONS

Hassan, A. et al, Energy-efficient Hybrid DRAM/NVM Main Memory, Nov. 6, 2015 <http://sc15.supercomputing.org/sites/all/themes/SC15images/doctoral_showcase/doc_files/drs114s2-file2.pdf>.*
(Continued)

*Primary Examiner* — Michael T Tran
(74) *Attorney, Agent, or Firm* — Trop, Pruner & Hu P.C.

(57) ABSTRACT

In some examples, a hybrid memory device includes multiple memory cells, where a given memory cell of the multiple memory cells includes a volatile memory element having a plurality of layers including electrically conductive layers and a dielectric layer between the electrically conductive layers, and a non-volatile resistive memory element to store different data states represented by respective different resistances of the non-volatile resistive memory element, the non-volatile resistive memory element having a plurality of layers including electrically conductive layers and a resistive switching layer between the electrically conductive layers of the non-volatile resistive memory element.

19 Claims, 7 Drawing Sheets

(51) Int. Cl.
*H01L 27/108* (2006.01)
*H01L 27/24* (2006.01)
*H01L 45/00* (2006.01)

(52) U.S. Cl.
CPC ...... *H01L 27/2436* (2013.01); *H01L 45/1608* (2013.01); *G11C 13/003* (2013.01); *G11C 13/004* (2013.01); *G11C 13/0069* (2013.01); *G11C 2213/31* (2013.01); *G11C 2213/32* (2013.01); *G11C 2213/34* (2013.01); *G11C 2213/79* (2013.01); *H01L 45/146* (2013.01); *H01L 45/147* (2013.01)

(58) Field of Classification Search
USPC .................................................. 365/148, 178
See application file for complete search history.

(56) References Cited

U.S. PATENT DOCUMENTS

| | | | |
|---|---|---|---|
| 2009/0152608 A1 | 6/2009 | Choi | |
| 2012/0127779 A1 | 5/2012 | Scheuerlein et al. | |
| 2014/0229654 A1* | 8/2014 | Goss | G06F 12/0246 711/103 |
| 2014/0289457 A1* | 9/2014 | Catthoor | G06F 12/0893 711/103 |
| 2015/0003175 A1 | 1/2015 | Ramanujan | |
| 2015/0243886 A1 | 8/2015 | Narayanan et al. | |
| 2015/0279463 A1 | 10/2015 | Berke | |
| 2016/0254448 A1 | 9/2016 | Choi et al. | |
| 2017/0220293 A1* | 8/2017 | Kim | G11C 5/06 |
| 2017/0255398 A1* | 9/2017 | Niu | G06F 3/0613 |
| 2017/0255406 A1* | 9/2017 | Tomishima | G11C 16/20 |
| 2018/0144813 A1* | 5/2018 | Hong | G11C 16/04 |
| 2018/0150219 A1* | 5/2018 | Chen | G06F 3/061 |
| 2018/0173442 A1* | 6/2018 | Kirkpatrick | G06F 3/0659 |
| 2018/0174668 A1* | 6/2018 | Nigam | G11C 7/1009 |
| 2018/0181519 A1* | 6/2018 | Cheng | G06F 12/0804 |
| 2018/0203758 A1* | 7/2018 | Kannan | G01R 31/3171 |
| 2018/0204820 A1* | 7/2018 | Zhai | H01L 24/97 |
| 2018/0210830 A1* | 7/2018 | Malladi | G06F 12/0866 |
| 2018/0225059 A1* | 8/2018 | Haas Costa | G06F 13/16 |
| 2018/0285198 A1* | 10/2018 | Dantkale | G06F 12/128 |
| 2018/0285252 A1* | 10/2018 | Kwon | G06F 12/0848 |
| 2018/0300081 A1* | 10/2018 | Parker | G06F 12/0246 |
| 2018/0349041 A1* | 12/2018 | Zhou | G06F 3/0619 |
| 2019/0004940 A1* | 1/2019 | Boyd | G06F 13/1694 |
| 2019/0042120 A1* | 2/2019 | Kajigaya | G06F 1/3296 |
| 2019/0042405 A1* | 2/2019 | Boyle | G06F 12/0253 |
| 2019/0056999 A1* | 2/2019 | Foxworth | G06F 21/44 |
| 2019/0066763 A1* | 2/2019 | Apodaca | H01L 27/222 |
| 2019/0114373 A1* | 4/2019 | Subbian | G06N 5/046 |
| 2019/0173913 A1* | 6/2019 | Kras | G06Q 10/06314 |
| 2019/0198568 A1* | 6/2019 | Oda | H01L 45/141 |

OTHER PUBLICATIONS

Nkagawa, G., et al, Multi-level Queue NVM/DRAM Hybrid Memory Management with Language Runtime Support, Oct. 9-12, 2015 <https://dl.acm.org/doi/10.1145/2811411.2811531>.*
Ren, J et al., THYNVM: Enabling Software-transparent Crash Consistency in Persistent Memory Systems, Dec. 5-9, 2015 <https://cseweb.ucsd.edu/~jzhao/files/thynvm-micro2015.pdf>.*
http://www.memristor.org/reference/research/13/what-are-memristors—What are Memristors? downloaded Sep. 26, 2016 (7 pages).

\* cited by examiner

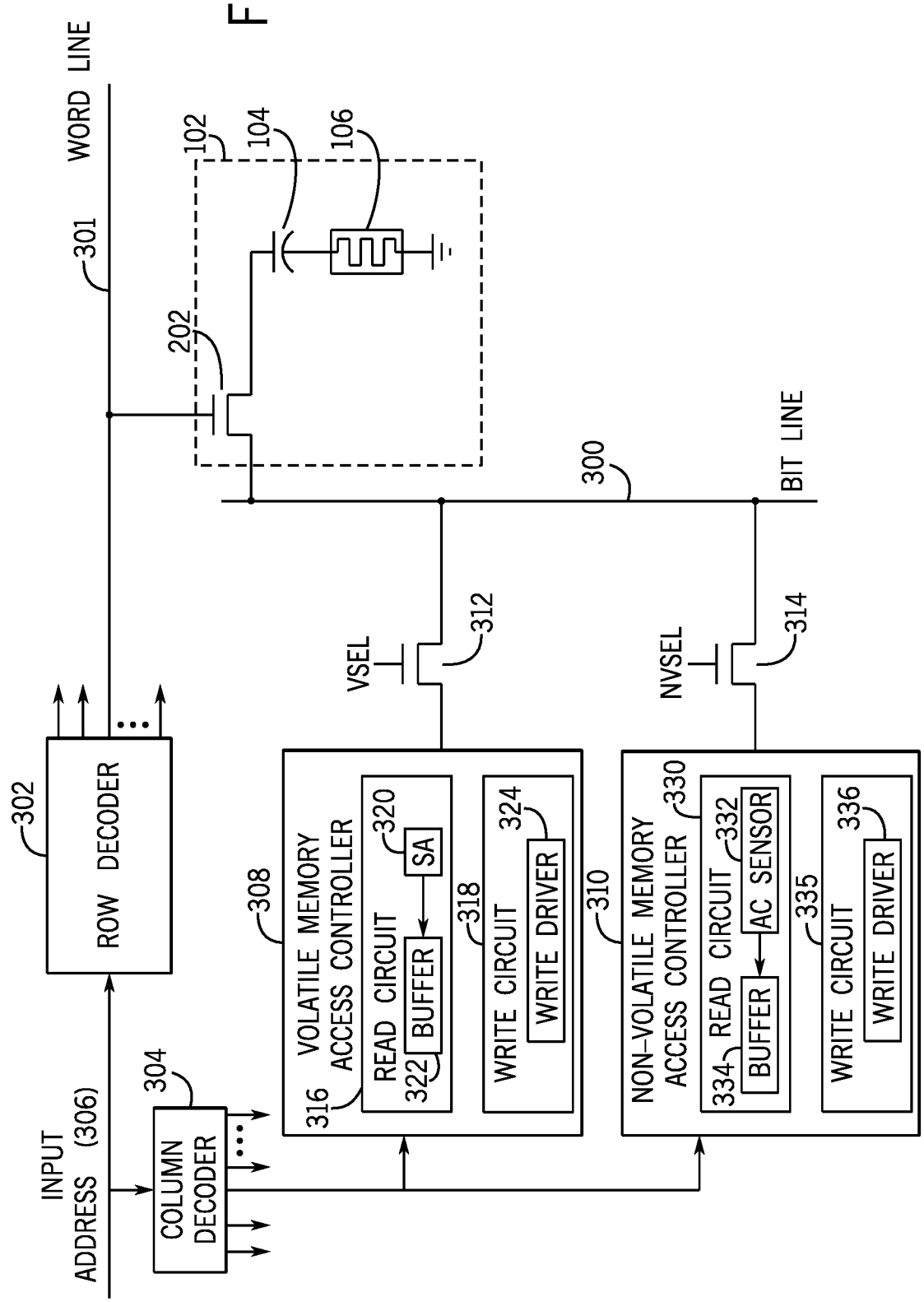

HYBRID MEMORY DEVICES

BACKGROUND

Electronic devices include memory devices to store data. In some examples, memory devices include dynamic random access memory (DRAM) memory devices. A DRAM device can be used as the main memory of an electronic device, where the DRAM device has a higher access speed than persistent storage such as a hard disk drive or a solid state drive.

BRIEF DESCRIPTION OF THE DRAWINGS

Some implementations of the present disclosure are described with respect to the following figures.

FIG. 3 is a block diagram of various components of a hybrid memory device according to further examples.

DETAILED DESCRIPTION

Figure 1:
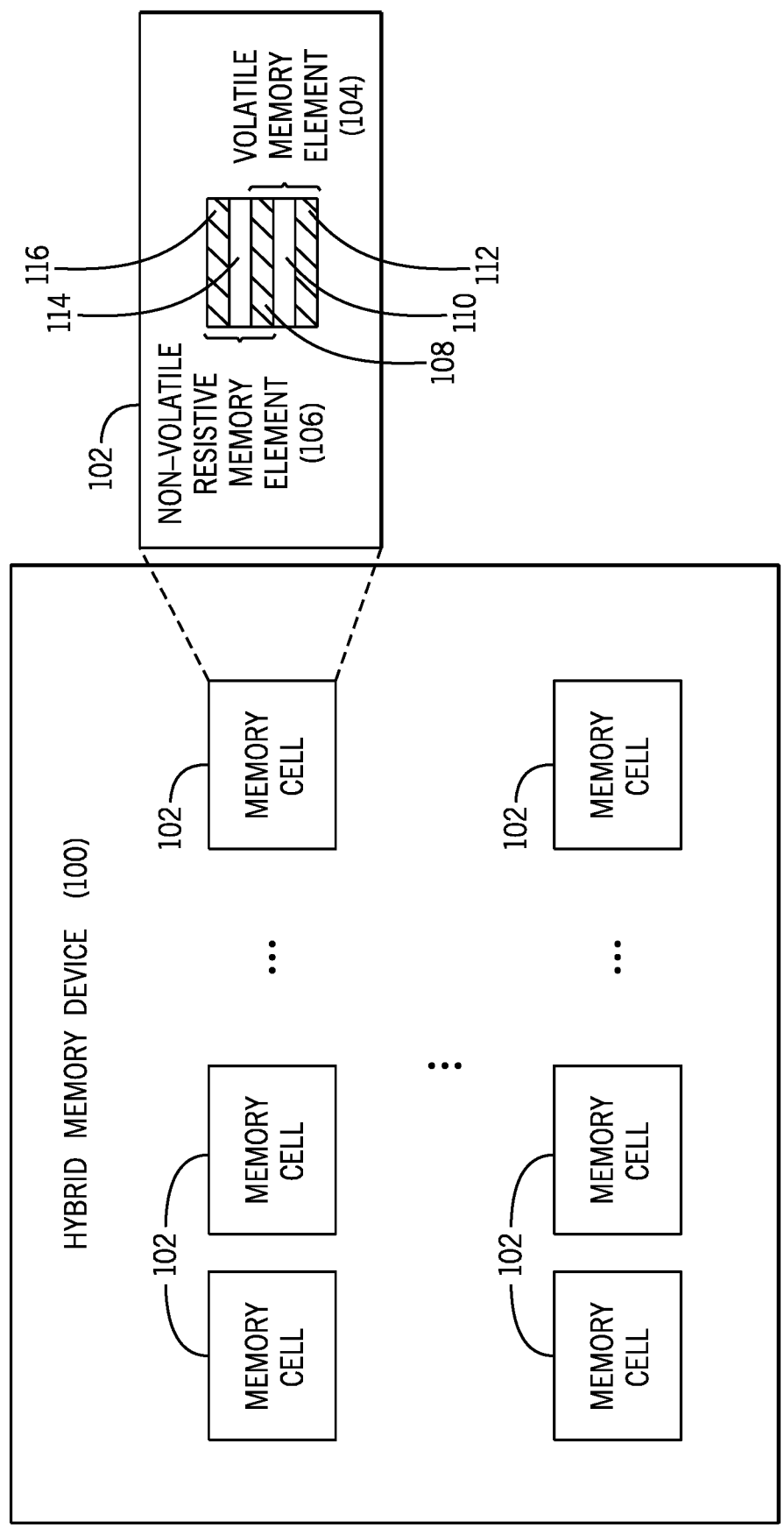
FIG. 1 is a block diagram of a hybrid memory device according to some examples.

In the present disclosure, the article "a," "an", or "the" can be used to refer to a singular element, or alternatively to multiple elements unless the context clearly indicates otherwise. Also, the term "includes," "including," "comprises," "comprising," "have," or "having" is open ended and specifies the presence of the stated element(s), but does not preclude the presence or addition of other elements.

A dynamic random access memory (DRAM) device has several desirable characteristics as compared to other types of memory or storage devices, where such characteristics can include any or some combination of the following: higher access speed, lower power consumption, higher endurance, and lower cost per bit. An issue with DRAM devices is that they have to be refreshed on a continual basis, and moreover, DRAM devices are volatile or non-persistent; if electrical power is removed from a DRAM device, then data stored by the DRAM device is lost.

A DRAM device includes an array of memory cells each including a storage capacitor. The storage capacitor can be written with a '0' or a '1' data state, where a '0' data state corresponds to a low voltage level written to the storage capacitor, and a '1' data state corresponds to a high voltage level written to the storage capacitor. A low voltage level is a voltage level that is less than a specified threshold, while a high voltage level is a voltage level that is greater than the specified threshold.

After a high voltage level (for a '1' data state) is written to the storage capacitor of a DRAM memory cell, the charge in the storage capacitor begins to leak away. Over time, the voltage level of the storage capacitor can drop below the specified threshold such that the storage capacitor no longer stores a '1' data state. To address this issue, a refresh of the DRAM memory cells can be performed. In a refresh operation, data states of the DRAM memory cells can be read by circuitry of the DRAM device, and such data states are written back to the DRAM memory cells to refresh the charge of the DRAM memory cells.

When power is removed from a DRAM device, such as when an electronic device in which the DRAM device is included is powered off or placed into a sleep state, the data stored in the memory cells of the DRAM device is lost due to leakage of charge away from storage capacitors of the DRAM device. When the electronic device later transitions back to an operational state (a higher power state where power is restored to electronic components of the electronic device) from a power off state, the data that was previously stored in the DRAM device is no longer available. As a result, the electronic device would have to retrieve data from a slower persistent storage, such as a hard disk drive implemented with a magnetic rotational storage medium or a solid state drive implemented with a flash memory device or other non-volatile memory device, in order to populate the data in the DRAM device. Populating data in the DRAM device with data from persistent storage takes time and can slow down the operation of the electronic device when transitioning back to an operational state from a power off state. A power off state is a state where power is removed from various electronic components, including a memory device, of an electronic device.

In accordance with some implementations of the present disclosure, a hybrid memory device includes memory cells where each of at least some of the memory cells includes both a volatile memory element (e.g., a DRAM memory element) and a non-volatile resistive memory element (which is also referred to as a memristor element). The memristor element is able to store different data states that are represented by respective different resistances of the memristor element. During a write of the memristor element, the memristor element can be programmed to a first resistance to represent a first data state, or a second, different resistance to represent a second, different data state. During a read of the memristor element, the resistance of the memristor element can be sensed to determine the data state stored by the memristor element. In further examples, a memristor element can store more than two data states using more than two resistances.

FIG. 1 is a block diagram of an example hybrid memory device 100 according to some implementations of the present disclosure. The hybrid memory device 100 includes multiple memory cells 102, which can be arranged as an array of memory cells, where the array includes rows of memory cells and columns of memory cells.

Each of at least some of the memory cells includes both a volatile memory element 104 and a non-volatile resistive memory element 106. The non-volatile resistive memory element 106 is also referred to as a memristor element 106. The volatile memory element 104 is formed using multiple layers, including a first electrically conductive layer 108, a first dielectric layer 110, and a second electrically conductive layer 112. The memristor element 106 is formed using multiple layers including the first electrically conductive layer 108, a resistive switching layer 114, and a third electrically conductive layer 116. The resistive switching layer 114 is a layer whose resistance can be changed by input energy, such as by a bias voltage.

In FIG. 1, the layers 108, 110, 112, 114, and 116 are shown as being arranged in a vertical stack. In other examples, the layers 108, 110, 112, 114, and 116 can be formed in a horizontal stack, or a stack of a different orientation. In yet further examples, the layers 108, 110, 112, 114, and 116 do not have to be arranged in a stack, but rather can be arranged in different stacks, where a portion of the layer 108 and the layers 110 and 112 are arranged in a first stack, and another portion of the layer 108 and the layers 114 and 116 are arranged in a second stack.

Additionally, although FIG. 1 shows each of the layers 108, 110, 112, 114, and 116 as being a generally planar layer, in other examples, a layer of the volatile memory element 104 and/or memristor element 106 can have a non-planar shape, such as a serpentine shape, a general U shape, a vertical arrangement, a three-dimensional arrangement, and so forth.

In arrangements according to FIG. 1, the volatile memory element 104 and the memristor element 106 share a common electrically conductive layer (i.e., the electrically conductive layer 108). However, at least one electrically conductive layer (e.g., 112) of the volatile memory element 104 is separate and distinct from at least one electrically conductive layer (e.g., 116) of the memristor element 106 (in other words, the electrically conductive layer 112 of the volatile memory element 104 is not part of the memristor element 106, and the electrically conductive layer 116 of the memristor element 106 is not part of the volatile memory element 104). In other examples, the stack of layers of the volatile memory element 104 and the stack of layers of memristor element 106 do not share layers. In the latter examples, an electrically conductive layer of the volatile memory element 104 is electrically connected to an electrically conductive layer of the memristor element 106.

In some examples, the electrically conductive layers 108, 112, and 116 can be formed of a metal, such as tantalum, platinum, titanium, aluminum, copper, and so forth. In other examples, the electrically conductive layers 108, 112, and 116 can be formed of a metal allow (e.g., an aluminum-copper alloy, a tantalum-aluminum alloy, etc.), a metal compound (e.g., titanium nitride, etc.), a conductive oxide (e.g., titanium oxide, indium tin oxide (ITO), etc.), transition metal dichalcogenides, and a conductive polymer (e.g., poly(3,4-ethylenedioxythiophene) polystyrene sulfonate, etc.). In further examples, the electrically conductive layers 108, 112, and 116 can be formed of a non-metallic electrically conductive material, such as graphene ($MoS_2$), graphite, iodine doped poly-acetylene, and so forth.

In some examples, the resistive switching layer 114 of the memristor element 106 can include an oxide-containing material, where the oxide-containing material includes a non-stoichiometric oxide, such as hafnium oxide ($HfO_x$), tantalum oxide ($TaO_x$), titanium oxide ($TiO_x$), yttrium oxide ($YO_x$), niobium oxide ($NbO_x$), zirconium oxide ($ZrO_x$), aluminum oxide ($AlO_x$), magnesium oxide ($MgO_x$), dysprosium oxide ($DyO_x$), lanthanum oxide ($LaO_x$), and so forth. In additional examples, the resistive switching layer 114 can include transition metal oxides (TMO) (oxide compounds composed of oxygen atoms bound to transition metals), complex oxides (a chemical oxide compound that contains oxygen and at least two other elements (or oxygen and just one other element that is in at least two oxidation states), perovskite oxides (a class of oxide compounds with general perovskite formula $ABO_3$ or $A_2BO_4$), and some non-oxide insulators, such as chalcogenides (a chemical compound made up of at least one chalcogen anion and at least one more electropositive element) including transition metal dichalcogenide (TMD), flexible and organic materials, and even carbon nanotube and graphene-based structures. In other examples, the resistive switching layer 114 of the memristor element 106 can include another type of material, such as a nitride-containing material, for example, aluminum nitride, gallium nitride, tantalum nitride, silicon nitride, and so forth.

In some examples, the dielectric layer 110 of the volatile memory element 104 includes an insulating material, such as an oxide-containing material, where the oxide-containing material includes a full oxide or a stoichiometric oxide. Examples of such oxide-containing materials include hafnium oxide ($Hf_2O_5$), tantalum oxide ($Ta_2O_5$), titanium oxide ($Ti_2O_5$), hafnium oxide ($Hf_2O_5$), tantalum oxide ($Ta_2O_5$), titanium oxide ($Ti_2O_5$), yttrium oxide ($Y_2O_5$), niobium oxide ($Nb_2O_5$), zirconium oxide ($Zr_2O_5$), aluminum oxide ($Al_2O_5$), magnesium oxide ($Mg_2O_5$), dysprosium oxide ($Dy_2O_5$), lanthanum oxide ($La_2O_5$), and so forth. In other examples, the dielectric layer 110 can include another type of material, such as a nitride-containing material, including those listed above.

In further examples, other materials can be used to form the dielectric layer 110 or the resistive switching layer 114.

Figure 2A:
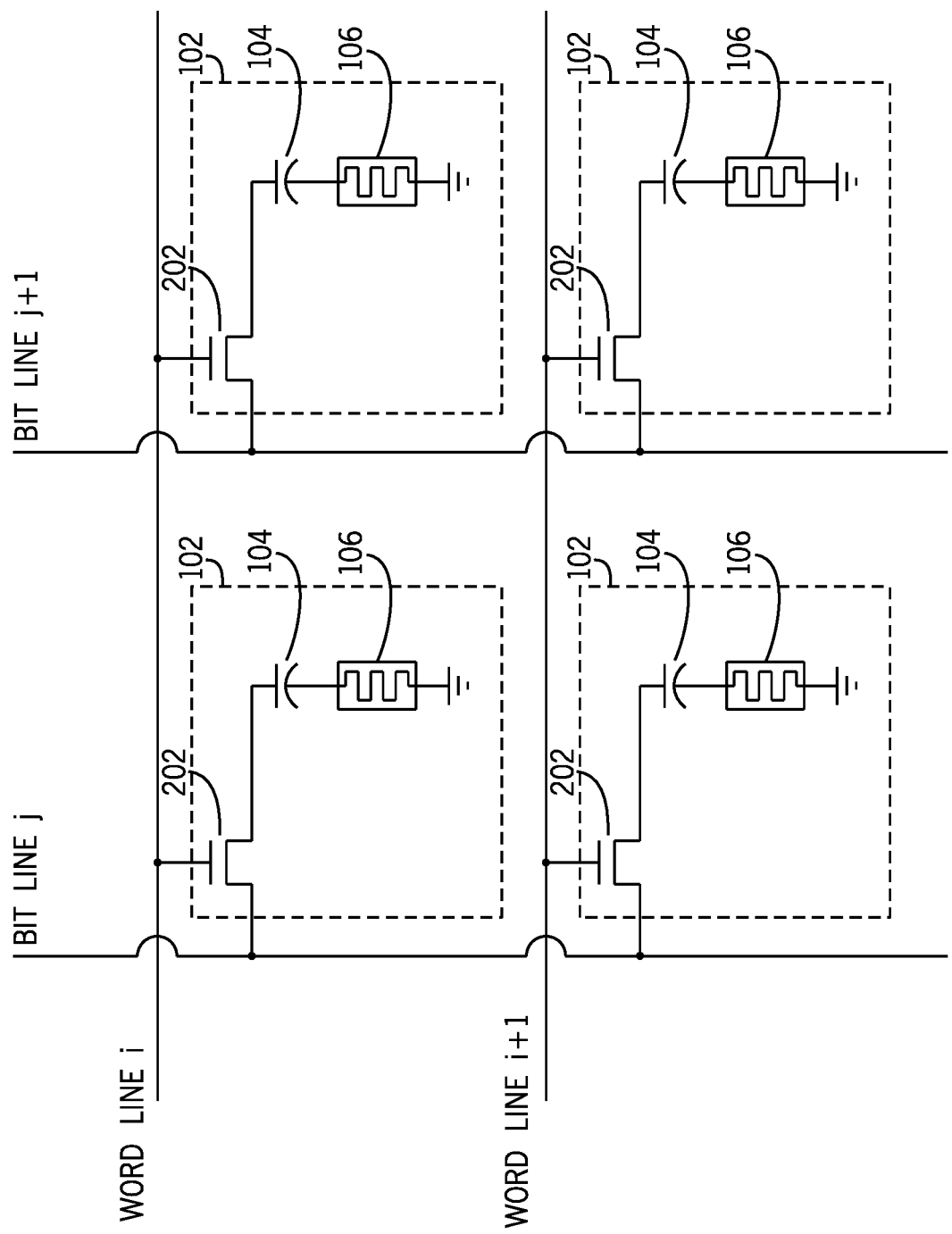
FIG. 2A is a schematic diagram of memory cells of a hybrid memory device according to some examples.

FIG. 2A is a schematic diagram that illustrates some memory cells 102 of an array of memory cells. Each memory cell 102 has a volatile memory element 104 that includes a storage capacitor, and a memristor element 106. In examples according to FIG. 2A, in each memory cell 102, the volatile memory element 104 is arranged in series with the memristor element 106. In addition, each memory cell 102 includes an access transistor 202 that controls access of the memory cell 102. In some examples, the access transistor 202 can be implemented as a metal-oxide-silicon (MOS) field effect transistor (MOSFET). When the access transistor 202 of a given memory cell 102 is turned on in response to assertion of a respective word line (word line i and word line i+1 are shown in FIG. 2A) to a high voltage, the volatile memory element 104 or memristor element 106 of the given memory cell 102 can be accessed through the activated access transistor 202. The volatile memory element 104 or memristor element 106 of the given memory cell 102 is coupled through the activated access transistor 202 to a respective bit line (bit line j and bit line j+1 are shown in FIG. 2A). An electrical voltage or electrical current of the respective bit line is affected by the data state stored by the volatile memory element 104 or memristor element 106 of the given memory cell 102. A reading circuit (not shown in FIG. 2A) can sense the voltage or current of the respective bit line to determine the data state that is stored in the volatile memory element 104 or memristor element 106 of the given memory cell 102.

On the other hand, when the respective word line of the given memory cell 102 is de-asserted to a low voltage, the access transistor 202 is turned off, which isolates the given memory cell 102 from the respective bit line.

In some examples, each word line corresponds to a row of memory cells and each bit line corresponds to a column of memory cells. The combination of a word line and a bit line corresponds to a respective memory cell 102.

Figure 2B:
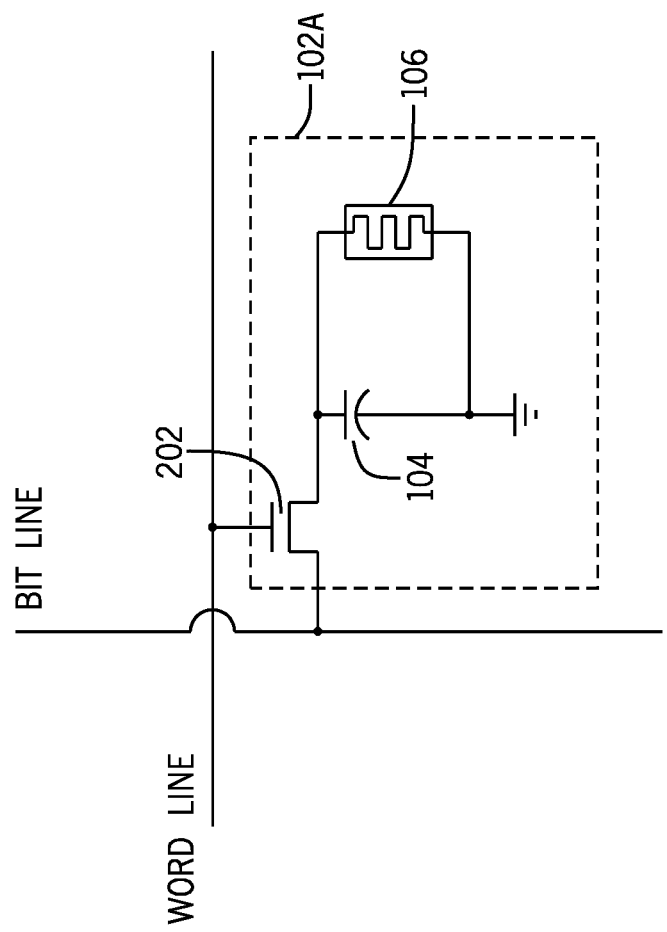
FIG. 2B is a schematic diagram of a memory cell according to alternative examples.

FIG. 2B shows a memory cell 102A according to alternative examples, which includes a volatile memory element 106 arranged in parallel with the memristor element 106. The volatile memory element 106 and the memristor element 106 are accessed through an access transistor 202 of the memory cell 102A.

FIG. 3 is a block diagram that shows circuitry to perform a read and write of a memory cell 102. The hybrid memory device 100 includes a row decoder 302 and a column decoder 304. Each of the row decoder 302 and the column decoder 304 receives an input address 306. A first portion of the input address 306 is used by the row decoder 302 to assert a word line 301 (from among multiple word lines output by the row decoder 302). In other words, in response to the input address 306, the row decoder 302 asserts a selected word line to an active state, and maintains the remaining word lines in an inactive state.

The column decoder 304 is responsive to a second portion of the input address 306 to select a column, and more specifically, a bit line 300 of multiple bit lines. Outputs from the column decoder 304 are used to select from among multiple circuits to read from the selected bit line 300.

The hybrid memory device 100 further includes a volatile memory access controller 308 that is to perform read and write of volatile memory elements 104 in the memory cells 102, and a non-volatile memory access controller 310 to perform reads and writes of memristor elements 106 in the memory cells 102. A "controller" can refer to a hardware processing circuit implemented with transistors and associated circuitry.

In the example of FIG. 3, the volatile memory access controller 308 and non-volatile memory access controller 310 are depicted as performing reads and writes with respect to a memory cell 102 connected to a specific bit line 300. Note that more generally, each of the volatile memory access controller 308 and non-volatile memory access controller 310 can be used to selectively perform reads and writes from respective bit lines, in response to outputs of the column decoder 304.

Although the example of FIG. 3 depicts performing reads and writes of just one memory cell 102, it is noted that reads and writes of multiple memory cells can be performed concurrently by the volatile memory access controller 308 or the non-volatile memory access controller 310.

The volatile memory access controller 308 is connected to the bit line 300 by a first switch implemented as a first transistor 312, while the non-volatile memory access controller 310 is connected to the bit line 300 through a second switch implemented as a second transistor 314. The transistor 312 is controlled by a volatile memory select signal VSEL, which is asserted to an active state when performing reads and writes of the volatile memory elements 104 of the memory cells 102. On the other hand, the transistor 314 is controlled by a non-volatile memory select signal NVSEL, which is asserted to an active state to perform reads and writes of memristor elements 106 of the memory cells 102. Although not shown, the signals VSEL and NVSEL are generated by a controller that is able to receive an instruction regarding whether to perform an access of volatile memory elements or memristor elements. Note that just one of the transistors 312 and 314 would be activated at any given time.

The volatile memory access controller 308 includes a read circuit 316 and a write circuit 318. The read circuit 316 includes a sense amplifier 320. Assuming that a read operation of volatile memory elements 104 is being performed, the VSEL signal is asserted to an active state, while the NVSEL signal is de-asserted to an inactive state. Also, it is assumed that the word line 301 has been asserted to an active state, which turns on the access transistor 202 of the memory cell 102. The voltage of the storage capacitor of the volatile memory element 104 is transferred to the bit line 300, and passed through the transistor 312 to the sense amplifier 320. The sense amplifier 320 detects the voltage level of the bit line 300 and outputs either a high voltage level (corresponding to a '1' data state) or a low voltage level (corresponding to a '0' data state), where the output voltage from the sense amplifier 320 is stored in a read buffer 322. The data stored in the buffer 322 can be retrieved for output from the hybrid memory device 100.

The write circuit 318 of the volatile memory access controller 308 includes a write driver 324. During a write operation, depending on the data value that is to be written to the volatile memory element 104 of the memory cell 102, the write driver 324 can either drive the bit line 300 to a high voltage level or a low voltage level through the transistor 312. The voltage is passed through the access transistor 202 for storage in the storage capacitor of the volatile memory element 104.

The non-volatile memory access controller 310 includes a read circuit 330 and a write circuit 335. In accordance with some implementations of the present disclosure, the read circuit 330 can use an alternating current (AC) sense technique that provides an AC measurement indicative of the impedance of the memory cell 102. Since the impedance of the storage capacitor of the volatile memory element 104 in the memory cell 102 is known, the impedance or resistance of the memristor element 106 in the memory cell 102 can be derived based on the overall impedance of the memory cell 102.

An AC sense technique involves using an AC signal, which can be in the form of a sine way having a voltage amplitude. In some examples, the voltage amplitude of the oscillating signal is relatively low, such as on the order of less than or equal to 0.5 volts, or in other examples, less than or equal to 0.3 volts, or in further examples, less than or equal to 0.2 volts. By using an AC signal having a low voltage amplitude to sense the resistance of the memristor element 106 in the memory cell 102, the resistance of the memristor element 106 would not be disturbed by the read operation. In this way, the data state stored by the memristor element 106 is not destroyed by a read operation.

Assuming that a read operation is in progress of the non-volatile memory portion of the hybrid memory device 100, the NVSEL signal is asserted to an active state, while the VSEL signal is de-asserted to an inactive state. Also, it is assumed that the memory cell 102 in FIG. 3 is selected by asserting the word line 301 to an active state. In examples where the volatile memory element 104 and the memristor element 106 are arranged in series, as shown in FIG. 3, an AC signal generated by the read circuit 330 propagates through the transistors 314 and 202 and through the storage capacitor of the volatile memory element 104 to the memristor element 106. Note that if the oscillating signal has a sufficiently high frequency, the storage capacitor of the volatile memory element 104 appears as a short circuit to the oscillating signal. Generally, the impedance of the capacitor is inversely proportional to the frequency of a signal. The higher the frequency, the lower the impedance of the capacitor. In examples where the volatile memory element 104 and the memristor element 106 are arranged in parallel, as shown in FIG. 2B, the AC signal generated by the read circuit propagates through the transistors 314 and 202 to the memristor element 106.

In response to the AC signal, the AC current through the memristor element 106 can be measured by the AC sensor 332, to derive the resistance of the memristor element 106. The AC sensor 332 outputs a data value that corresponds to the sensed resistance, and this data value is stored in a data buffer 334 that can be retrieved for output by the hybrid memory device 100. A first resistance corresponds to a first data state, while a second resistance corresponds to a second, different data state.

The write circuit 335 of the non-volatile memory access controller 310 includes a write driver 336, which can perform a write of the memristor element 106 through the transistors 314, 202 and through the storage capacitor of the volatile memory element 104. The write circuit 336 uses a direct current (DC) write of the memristor element 106. The write driver 336 can apply either a positive bias voltage across the memristor element 106, or a negative bias voltage across the memristor element 106. The positive or negative bias voltage has an amplitude that is much greater than the amplitude of the AC signal used to read the memristor element 106. For example, the positive or negative bias voltage for programming a resistance of the memristor element 106 can have an amplitude of about 5 volts, or some other voltage level. In such examples, the positive bias voltage applied to the memristor element 106 is +5 volts, and the negative bias voltage applied to the memristor element 106 is −5 volts. Memristors are two-terminal passive devices that can be electrically switched between two states including a high-resistance state (HRS) and a low-resistance state (LRS). The switching event from a HRS to a LRS is called a "Set" or "On" switching process, which occurs if the amplitude of the applied positive bias voltage is greater than a Set threshold voltage. Conversely, the switching from a LRS to a HRS is called a "Reset" or "Off" switching process, which occurs if the amplitude of the applied negative bias voltage is less than a Reset threshold voltage.

Under a positive bias voltage, the resistance of the memristor element 106 can be reduced. Under a negative bias voltage, the resistance of the memristor element 106 can be increased. Once the resistance of the memristor element 106 is modified by the application of the respective bias voltage by the write driver 336, the resistance of the memristor element 106 is maintained persistently, such that the memristor element 106 can "remember" the data state to which the memristor element 106 is programmed.

Figure 4:
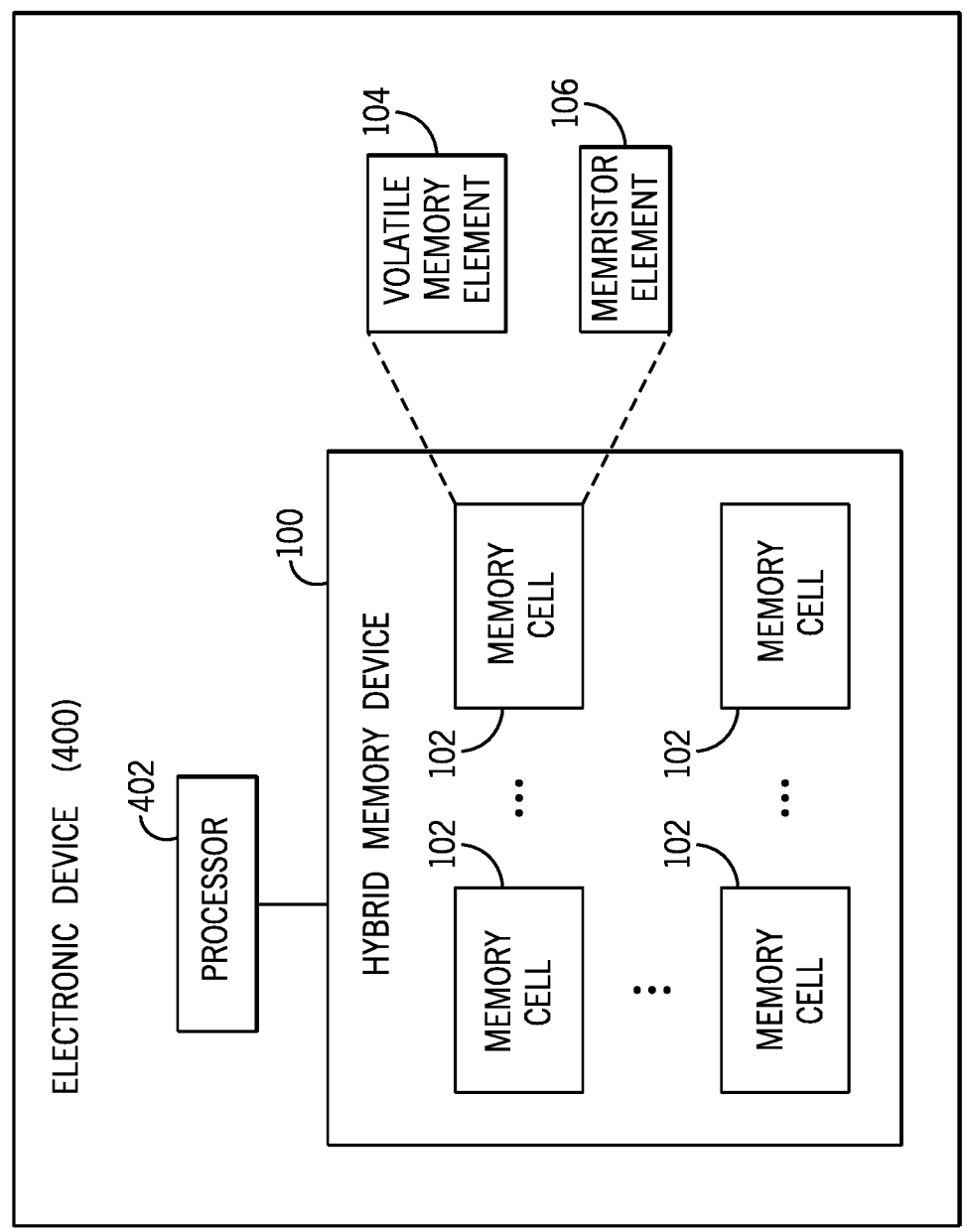
FIG. 4 is a block diagram of an electronic device that includes a hybrid memory device according to some examples.

FIG. 4 is a block diagram of an example electronic device 400, which can be a computer (e.g., a notebook computer, a desktop computer, a tablet computer, a server computer, etc.), a handheld device (e.g., a smartphone, a personal digital assistant, etc.), a wearable device (e.g., a smart watch, smart eyeglasses, a head-mounted device, etc.), a game appliance, a household appliance, a vehicle, a sensor device, a printing system, a communications node, and so forth. The electronic device 400 includes a processor 402, which can include any or some combination of the following: a microprocessor, a core of a multi-core microprocessor, a microcontroller, a programmable gate array, a programmable integrated circuit device, or other hardware processing circuit.

The processor 402 is able to access the hybrid memory device 100 to perform reads and writes of the hybrid memory device 100. The hybrid memory device 100 includes memory cells, where each of at least some of the memory cells 102 includes both a volatile memory element 104 and a memristor element 106 as discussed above.

Figure 5:
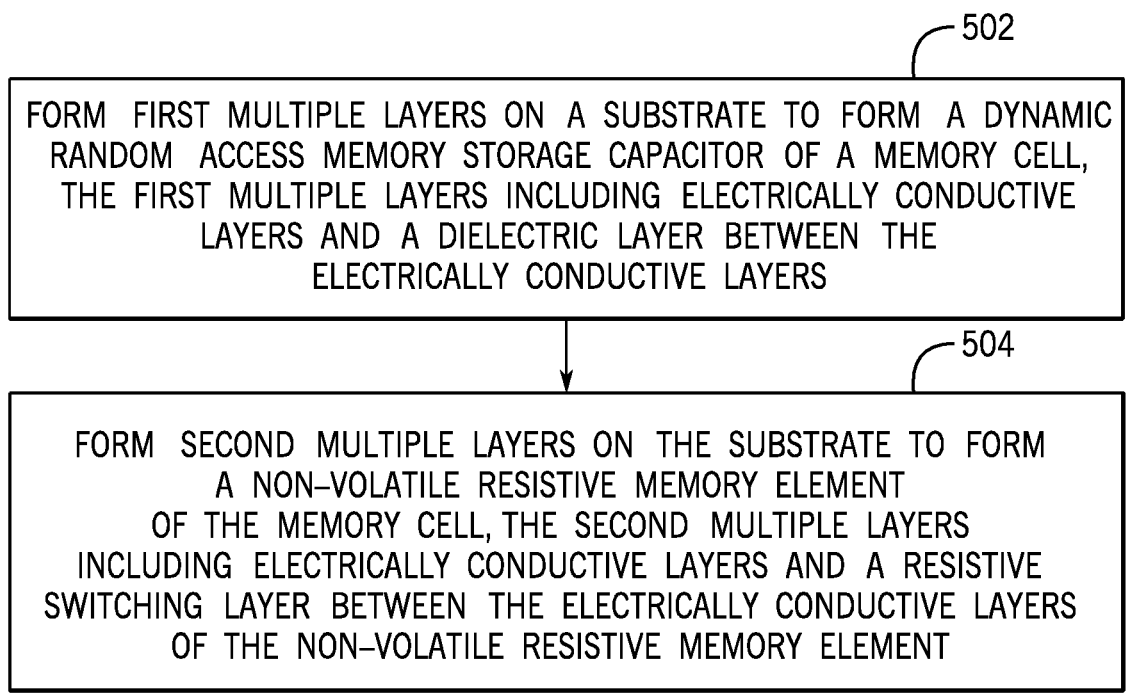
FIG. 5 is a flow diagram of a process of forming a hybrid memory device according to some examples.

FIG. 5 is a flow diagram of a process of forming a hybrid memory device according to some examples. The process of FIG. 5 includes forming (at 502) first multiple layers on a substrate to form a dynamic random access memory storage capacitor of a memory cell of the hybrid memory device, the first multiple layers including electrically conductive layers and a dielectric layer between the electrically conductive layers.

The process further includes forming (at 504) second multiple layers on the substrate to form a non-volatile resistive memory element of the memory cell, the second multiple layers including electrically conductive layers and a resistive switching layer between the electrically conductive layers of the non-volatile resistive memory element, and where an electrically conductive layer of the non-volatile resistive memory element is electrically connected to an electrically conductive layer of the dynamic random access memory storage capacitor. The first multiple layers and the second multiple layers are formed on a region of the substrate that corresponds to the memory cell.

Figure 6:
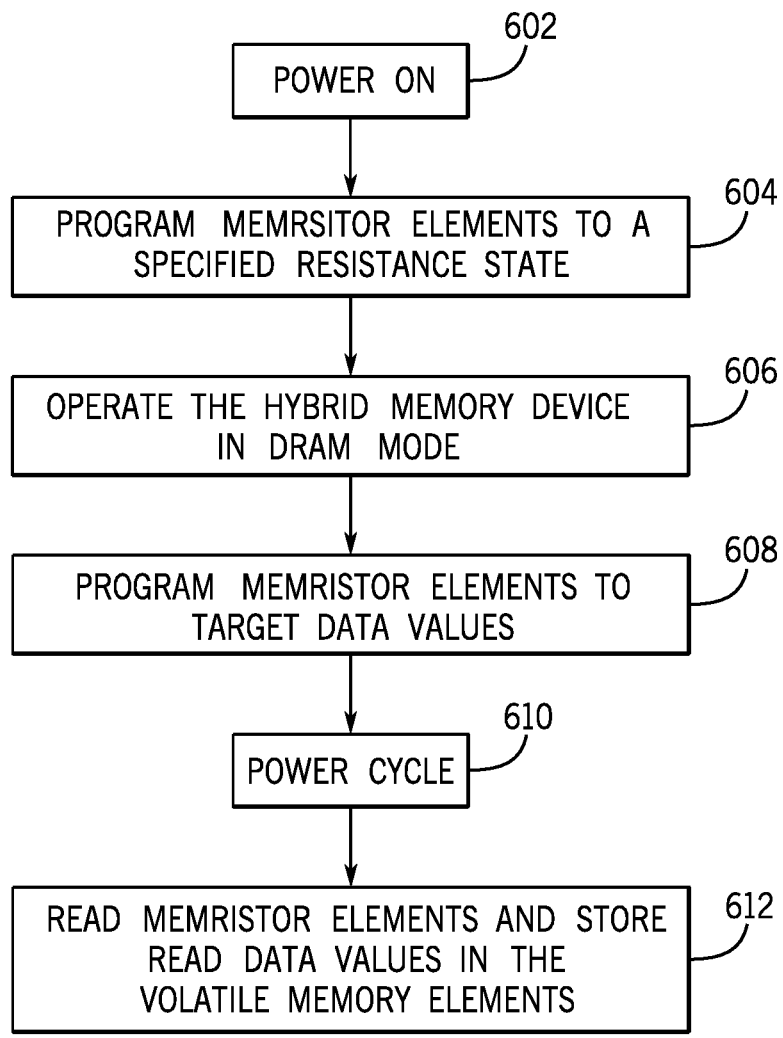
FIG. 6 is a flow diagram of a process of operating a hybrid memory device according to further examples.

FIG. 6 is a flow diagram of example operations that can be performed by the hybrid memory device 100 according to some implementations. The hybrid memory device 100 powers on (at 602). It is assumed that at the time of powering on (at 602), the non-resistive memory elements of the hybrid memory device 100 do not store any data, and that it is desired to use the volatile memory elements of the hybrid memory device 100, in other words, the DRAM portion of the hybrid memory device 100. The hybrid memory device 100, after powering on, programs (at 604) the memristor memory elements 106 of the memory cells 102 of the hybrid memory device 100 to a specified resistance state. In examples where the memristor element of each memory cell is connected in series to the storage capacitor of the volatile memory element of the memory cell (as shown in FIG. 2A), the memristor element can increase the overall capacitance and/or resistance of the memory cell. To reduce the amount of additional capacitance and/or resistance added by the memristor element, the memristor element is programmed to its low resistance state. Note that, in such examples, a high resistance state of the memristor element would add a greater amount of capacitance and/or resistance to the memory cell. By setting the memristor elements of the memory cells to the low resistance state, impact to performance of the DRAM portion of the hybrid memory cell 100 is reduced as compared to the impact of memristor elements set to a high resistance state.

On the other hand, in examples where the memristor element of each memory cell is connected in parallel to the storage capacitor of the volatile memory element of the memory cell (as shown in FIG. 2B), the memristor element can reduce the overall capacitance and/or resistance of the memory cell. In such latter examples, the memristor elements of the memory cells are programmed to the high resistance state to reduce the impact to performance of the DRAM portion.

After the memristor elements have been programmed to a specified resistance state, the hybrid memory device 100 is operated (at 606) in DRAM mode, i.e., read and write operations are performed with respect to the volatile memory elements of the memory cells 102.

At a later time, an electronic device in which the hybrid memory device 100 is included can receive an indication to power off. For example, a user may have activated a control element to power off the electronic device, or alternatively, the electronic device has determined that it should power off in response to determining that the electronic device has been idle for greater than a specified time duration, or that the electronic device has a low battery condition.

The electronic device can send an instruction to the hybrid memory device 100 to program (at 608) the memristor elements of a hybrid memory device 100 to target data values. For example, the instruction can specify that the memristor elements of the hybrid memory device 100 are to be programmed with the data states stored in the volatile memory elements of the hybrid memory device 100. To do so, the data states of the volatile memory elements are first read, and then written back to the memristor elements. In this way, prior to powering off the hybrid memory device 100, the data values stored in the DRAM portion of the hybrid memory device 100 can be made persistent in the memristor elements. In other examples, the memristor elements can be programmed to other data values.

The hybrid memory device 100 is power cycled (at 610), in which the hybrid memory device 100 is powered off, followed at a later time by powering on of the hybrid memory device 100. After the hybrid memory device 100 is powered on again, the hybrid memory device 100 reads (at 612) the memristor elements and stores the read data values in the volatile memory elements. In this way, data values stored in the DRAM portion of the hybrid memory device 100 are made available again after the power cycle 610.

By using the hybrid memory device 100 according to some implementations of the present disclosure, various features may be available, including higher speed, enhanced durability, and greater memory density. Additionally, data persistence is available due to the presence of the memristor elements. Further, since the memristor elements of the memory cells of the hybrid memory device 100 can be formed by adding a few more layers, the overall manufacturing cost of the hybrid memory device 100 would not be greatly increased as compared to the cost of manufacturing a DRAM-only device.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A hybrid memory device comprising:
a plurality of memory cells, wherein a given memory cell of the plurality of memory cells comprises:
a volatile memory element comprising a plurality of layers including electrically conductive layers and a dielectric layer between the electrically conductive layers; and
a non-volatile resistive memory element to store different data states represented by respective different resistances of the non-volatile resistive memory element, the non-volatile resistive memory element comprising a plurality of layers including electrically conductive layers and a resistive switching layer between the electrically conductive layers of the non-volatile resistive memory element;
a volatile memory access controller to access volatile memory elements of the plurality of memory cells; and
a non-volatile memory access controller to access non-volatile resistive memory elements of the plurality of memory cells.

2. The hybrid memory device of claim 1, wherein the volatile memory element and the non-volatile resistive memory element of the given memory cell share a common electrically conductive layer.

3. The hybrid memory device of claim 1, wherein the plurality of layers of the volatile memory element form a dynamic random access memory (DRAM) storage capacitor, the plurality of layers of the volatile memory element comprising a first electrically conductive layer, the dielectric layer, and a second electrically conductive layer.

4. The hybrid memory device of claim 3, wherein the plurality of layers of the non-volatile resistive memory element comprise the first electrically conductive layer, the resistive switching layer, and a third electrically conductive layer.

5. The hybrid memory device of claim 4, wherein the first electrically conductive layer, the dielectric layer, the second electrically conductive layer, the resistive switching layer, and the third electrically conductive layer are arranged in a stack of layers.

6. The hybrid memory device of claim 1, wherein the given memory cell further comprises:
a transistor activatable to access the given memory cell.

7. The hybrid memory device of claim 1, wherein the non-volatile memory access controller is to read the non-volatile resistive memory element of the given memory cell by using an alternating current (AC) read signal to sense a resistance of the non-volatile resistive memory element of the given memory cell.

8. The hybrid memory device of claim 7, herein the non-volatile memory access controller is to write the non-volatile resistive memory element of the given memory cell by using a direct current bias voltage to program a resistance of the non-volatile resistive memory element of the given memory cell.

9. The hybrid memory device of claim 1, wherein the non-volatile resistive memory element and the volatile memory element of the given memory cell are arranged in series.

10. The hybrid memory device of claim 1, wherein the non-volatile resistive memory element and the volatile memory element of the given memory cell are arranged in parallel.

11. An electronic device comprising:
a processor; and
a hybrid memory device accessible by the processor, the hybrid memory device comprising:
a plurality of memory cells, wherein a given memory cell of the plurality of memory cells comprises:
a storage capacitor formed with a first electrically conductive layer, a dielectric layer, and a second electrically conductive layer; and
a memristor element formed with the first electrically conductive layer, a resistive switching layer, and a third electrically conductive layer.

12. The electronic device of claim 11, wherein the given memory cell further comprises a transistor activatable to access the given memory cell, the hybrid memory device further comprising:
a first access controller to access the storage capacitor of the given memory cell through the transistor; and
a second access controller to access the memristor element of the given memory cell through the transistor.

13. A method of forming a hybrid memory device, comprising:
forming a first plurality of layers on a substrate to form a dynamic random access memory storage capacitor of a memory cell of the hybrid memory device, the first plurality of layers comprising electrically conductive layers and a dielectric conductive layer between the electrically conductive layers; and
forming a second plurality of layers on the substrate to form a non-volatile resistive memory element of the memory cell, the second plurality of layers comprising electrically conductive layers and a resistive switching layer between the electrically conductive layers of the non-volatile resistive memory element, wherein an electrically conductive layer of the non-volatile resistive memory element is electrically connected to an electrically conductive layer of the dynamic random access memory storage capacitor.

14. The method of claim 13, wherein the first plurality of layers and the second plurality of layers are formed on a region of the substrate that corresponds to the memory cell.

15. The electronic device of claim 11, wherein the first electrically conductive layer, the dielectric layer, the second electrically conductive layer, the resistive switching layer, and the third electrically conductive layer are arranged as a vertical stack of layers.

16. The electronic device of claim 11, wherein the resistive switching layer comprises an oxide-containing material.

17. The electronic device of claim 12, wherein the second access controller is to write the memristor element of the given memory cell by using a direct current bias voltage to program a resistance of the memristor element of the given memory cell.

18. The electronic device of claim 17, wherein the second access controller is to read the memristor element of the given memory cell by using an alternating current (AC) read signal to sense a resistance of the memristor element of the given memory cell.

19. The method of claim 13, wherein the electrically conductive layer of the non-volatile resistive memory element and the electrically conductive layer of the dynamic random access memory storage capacitor that are electrically connected are part of a common electrically conductive layer.

* * * * *